United States Patent [19]
Nagahara et al.

[11] Patent Number: 5,780,202
[45] Date of Patent: Jul. 14, 1998

[54] ANTISTATIC PHOTOSENSITIVE MULTILAYERED STRUCTURE AND METHOD FOR PRODUCING THE SAME

[75] Inventors: Shigenori Nagahara; Toshiaki Fujimura; Shinichi Tanaka, all of Ohtsu, Japan

[73] Assignee: Toyo Boseki Kabushiki Kaisha, Osaka, Japan

[21] Appl. No.: 417,549

[22] Filed: Apr. 6, 1995

[30] Foreign Application Priority Data

Apr. 8, 1994 [JP] Japan .................................. 6-070727

[51] Int. Cl.⁶ .................................................. G03C 1/492
[52] U.S. Cl. ............................. 430/271.1; 430/273.3; 430/961
[58] Field of Search ............................... 430/271.1, 273.1, 430/961

[56] References Cited

U.S. PATENT DOCUMENTS

| | | | |
|---|---|---|---|
| 4,786,558 | 11/1988 | Sumiya et al. | 428/454 |
| 4,956,252 | 9/1990 | Fryd et al. | 430/138 |

FOREIGN PATENT DOCUMENTS

| | | |
|---|---|---|
| 60-173055A | 9/1985 | Japan . |
| 60-211451A | 10/1985 | Japan . |
| 63-8648A | 1/1988 | Japan . |
| 1108542A | 4/1989 | Japan . |
| 1154138 | 6/1989 | Japan . |
| 1154138A | 6/1989 | Japan . |
| 2305805A | 12/1990 | Japan . |
| 3228060A | 10/1991 | Japan . |

*Primary Examiner*—Edward J. Cain
*Attorney, Agent, or Firm*—Kenyon & Kenyon

[57] ABSTRACT

An antistatic photosensitive multilayered structure of the present invention has at least a photosensitive layer and an antistatic cover film on a substrate in this order.

10 Claims, 2 Drawing Sheets

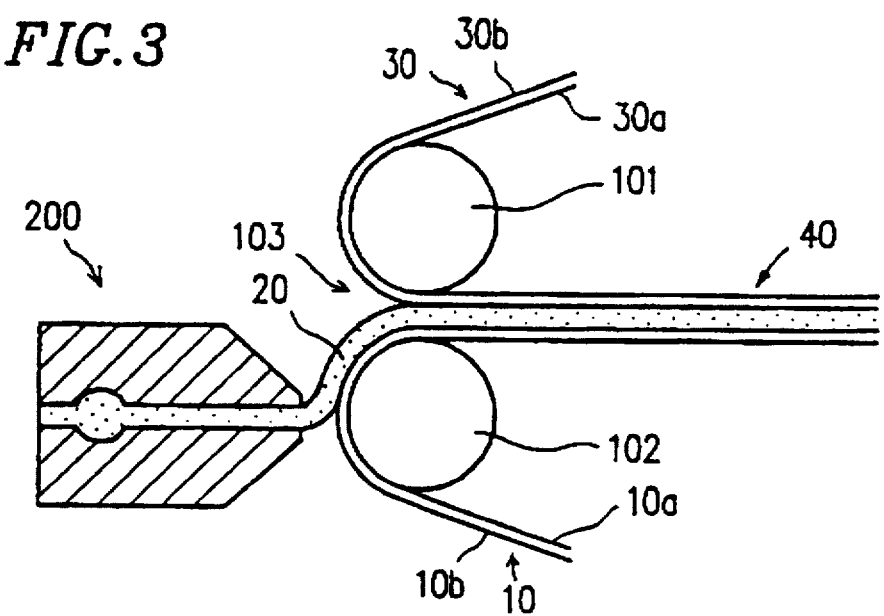

5,780,202

ANTISTATIC PHOTOSENSITIVE MULTILAYERED STRUCTURE AND METHOD FOR PRODUCING THE SAME

BACKGROUND OF THE INVENTION

1. Field of the Invention

The present invention relates to an antistatic photosensitive multilayered structure and a method for producing the same. More specifically, the present invention relates to an antistatic photosensitive multilayered structure having an outstanding antistatic property and image reproducibility and a method for producing the same.

2. Description of the Related Art

In the past, a method including the following steps has mainly been used in a plate-making process for forming an image using a photosensitive muiltilayered structure: (1) A photosensitive multilayered structure having a photosensitive resin layer, an antitack layer, and a cover film on a substrate in this order is prepared, cut into pieces with a required size, and placed on an image exposing platform; (2) The cover film is peeled off; (3) An original drawing film is placed over the photosensitive resin layer of the photosensitive multilayered structure; (4) The original drawing film and the photosensitive resin layer are adhered to each other in vacuo; and (5) The resultant multilayered structure is exposed to light.

However, the conventional photosensitive multilayered structure is likely to be charged (more specifically, static electricity is generated therein) when the cover film is peeled off. The reasons for this are considered as follows: The cover film itself has been charged before being peeled off; and the antitack layer and the base layer of the cover film are charged due to friction caused by peeling off the cover film. The multilayered structure thus charged attracts foreign matter such as dust and refuse, floating in or adhering to a plate-making workplace. The foreign matter thus adhered to the multilayered structure is fixed onto the surface of the photosensitive resin layer by vacuum adhesion and light exposure. The fixed foreign matter scatters light when being exposed to light, so that an image after being developed and resolution thereof are remarkably deteriorated. Furthermore, the foreign matter contaminates a printing original plate and forms pinholes and background stains in the printed matter, resulting in remarkable quality degradation thereof. Thus, the charging during plate-making causes serious problems such as remarkable deterioration of characteristics of the above-mentioned photosensitive multilayered structure, for example, printing plates such as a photosensitive convex plate, a photosensitive flat plate, a photosensitive concave plate, and a photosensitive flexographic plate, and a photoresist. Furthermore, this charging causes electric shocks to human bodies.

In order to prevent the above-mentioned charging during plate-making, generally, an ionize processing, an antistatic brush processing, a rinse processing, regulation of humidity in a plate-making workplace have been used. However, these processing steps are merely make-shift ones. More specifically, these processing steps do not decrease the charging of the base layer of the cover film and the charging caused by friction generated when the cover film is peeled off; therefore, they cannot substantially prevent foreign matter from adhering to the multilayered structure during plate-making.

As an attempt for substantially preventing foreign matter from adhering to the multilayered structure during plate-making, for example, Japanese Laid-Open Patent Publication No. 1-154138 discloses that a cationic compound is blended in a swellable non-adhesive light transmittable coating layer as an antitack layer. However, this method does not prevent the charging caused by friction generated when the cover film is peeled off. Thus, the problems of adhesion of foreign matter to the multilayered structure during plate-making and an electric shock to human bodies cannot be solved.

As described above, according to the plate-making process for forming an image using the conventional photosensitive multilayered structure, it is very difficult to prevent the charging of the base layer of the cover film, that of the multilayered structure, and the adhesion of foreign matter to the multilayered structure caused by the charging, so as to obtain a high quality image and to eliminate an electric shock to human bodies.

SUMMARY OF THE INVENTION

The antistatic photosensitive multilayered structure of the present invention includes at least a photosensitive layer and an antistatic cover film on a substrate in this order.

In one embodiment of the invention, the difference between surface roughness of the surface of the substrate opposite to the photosensitive layer and surface roughness of the surface of the antistatic cover film opposite to the photosensitive layer is not more than 3.5 μm.

In another embodiment of the invention, the difference between the coefficient of dynamic friction of the surface of the substrate opposite to the photosensitive layer and the coefficient of dynamic friction of the surface of the antistatic cover film opposite to the photosensitive layer is not more than 0.15.

In another embodiment of the invention, the surface resistivity of the antistatic cover film is not more than $10^{13} \Omega/cm^2$.

In another embodiment of the invention, an antitack layer is provided between the photosensitive layer and the antistatic cover film, the antistatic cover film has a base layer in contact with the antitack layer and an antistatic surface layer on a side opposite to the photosensitive layer, and the antistatic surface layer is made of a composition containing a polyolefin resin and a cationic surfactant.

In another embodiment of the invention, the cationic surfactant is contained in an amount of 0.01 to 20% by weight based on a total weight of an emulsion containing the cationic surfactant and the polyolefin resin, forming the antistatic surface layer.

In another embodiment of the invention, the substrate has a surface resistivity of not more than $10^{13} \Omega/cm^2$.

According to another aspect of the invention, a method for producing an antistatic photosensitive multilayered structure having at least a photosensitive layer and an antistatic cover film on a substrate in this order by extrusion-lamination, includes the step of:

supplying a photosensitive composition forming a photosensitive layer extruded by an extruder to a nip between a film for the substrate to be fed and advanced in one direction by one of a pair of rolls and the antistatic cover film to be fed and advanced in the same direction as that of the film for the substrate by the other of the pair of rolls, and heat-pressing the film for the substrate, the photosensitive resin composition, and the antistatic cover film to each other between the pair of rolls;

wherein the difference between surface roughness of the surface of the substrate which comes into contact with the ones of the pair of rolls and surface roughness of the surface of the antistatic cover film which comes into contact with the other of the pair of rolls is not more than 3.5 µm.

Alternatively, a method for producing an antistatic photosensitive multilayered structure having at least a photosensitive layer and an antistatic cover film on a substrate in this order by extrusion-lamination, includes the step of:

supplying a photosensitive composition forming a photosensitive layer extruded by an extruder to a nip between a film for the substrate to be fed and advanced in one direction by one of a pair of rolls and the antistatic cover film to be fed and advanced in the same direction as that of the film for the substrate by the other of the pair of rolls, and heat-pressing the film for the substrate, the photosensitive resin composition, and the antistatic cover film to each other between the pair of rolls;

wherein the difference between a coefficient of dynamic friction of the surface of the substrate which comes into contact with the one of the pair of rolls and a coefficient of dynamic friction of the surface of the antistatic cover film which comes into contact with the other of the pair of rolls is not more than 0.15.

Thus, the invention described herein makes possible the advantages of: (1) providing an antistatic photosensitive multilayered structure which does not attract foreign matter by being charged during plate-making so as to allow a high quality image to be formed; (2) providing an antistatic photosensitive multilayered structure allowing outstanding printed matter to be produced without background stain and pinholes; (3) providing an antistatic photosensitive multilayered structure which does not give any electric shocks to human bodies by being charged and which makes an operation of plate-making easy; (4) providing an antistatic photosensitive multilayered structure capable of relieving operators of mental and physical pains during plate-making; (5) providing a method for producing an antistatic photosensitive multilayered structure having these outstanding properties; and (6) providing a method for producing an antistatic photosensitive multilayered structure having an extremely smooth surface and outstanding image reproducibility.

These and other advantages of the present invention will become apparent to those skilled in the art upon reading and understanding the following detailed description with reference to the accompanying figures.

BRIEF DESCRIPTION OF THE DRAWINGS

FIG. 3 is a schematic view showing lamination steps in a method for producing an antistatic photosensitive multilayered structure of the present invention.

DESCRIPTION OF THE PREFERRED EMBODIMENTS

Figure 1:
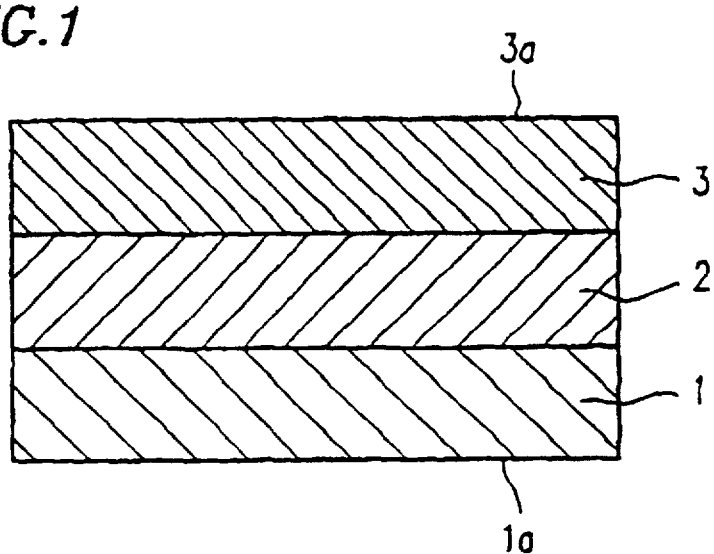
FIG. 1 is a cross-sectional view of an antistatic photosensitive multilayered structure of the present invention.

The antistatic photosensitive multilayered structure of the present invention has a photosensitive layer 2 and an antistatic cover film 3 in this order on a substrate 1, as shown in FIG. 1.

As the substrate 1, known polyesters can be used. Examples of the polyesters include those produced by condensation polymerization of aromatic dicarboxylic acids such as terephthalic acid, isophthalic acid, and naphthalene dicarboxylic acid, or esters thereof and glycols such as ethylene glycol, diethylene glycol, 1,4-butanediol, and neopentyl glycol. These polyesters are produced, for example, by allowing an aromatic dicarboxylic acid to react with a glycol; by transesterifying an alkyl ester of an aromatic dicarboxylic acid with a glycol, followed by condensation polymerization; or by condensation polymerization of a diglycol ester of an aromatic dicarboxylic acid. Examples of the polyester include polyethylene terephthalate, polyethylene butylene terephthalate, and polyethylene-2,6-naphthalate. The polyester can be a homopolyester containing one each kind of an aromatic dicarboxylic acid and a glycol, or can be a copolymer polyester containing at least two each kinds of aromatic dicarboxylic acids and/or glycols. Alternatively, the polyester can be a copolymer polyester further containing dicarboxylic acids other than the aromatic dicarboxylic acids.

The polyester is formed into a film by a conventional method and preferably biaxially oriented so as to be used as a substrate. For example, if required, various kinds of additives are added to the polyester; thereafter, the mixture is melt-kneaded and extruded. Preferably, an antistatic agent and inorganic particles can be added to the polyester.

The thickness of the substrate 1 is preferably in the range of 25 to 250 µm, more preferably in the range of 75 to 188 µm, and most preferably in the range of 100 to 125 µm. When the thickness is less than 25 µm, the strength as the substrate is not sufficient. When the thickness is more than 250 µm, it becomes difficult to attach the resulting multilayered structure to a print drum.

The surface roughness of a surface 1a of the substrate 1 is preferably in the range of 0.05 to 1.0 µm, more preferably in the range of 0.1 to 0.7 µm, and most preferably in the range of 0.3 to 0.6 µm. When the surface roughness is less than 0.05 µm, the surface 1a slips when being fed and advanced by the rolls, resulting in difficulty in producing a multilayered structure with a smooth surface. When the surface roughness is more than 1.0 µm, resistance caused between the surface 1a and the roll during feed and advance is too high, so that the resulting surface 1a becomes wavy, making it difficult to produce a layered structure with a smooth surface.

The coefficient of dynamic friction of the surface 1a of the substrate 1 is preferably in the range of 0.15 to 0.35, more preferably in the range of 0.2 to 0.3, and most preferably in the range of 0.25 to 0.30. When the coefficient of dynamic friction is less than 0.15, the surface 1a slips when being fed and advanced by the rolls, resulting in difficulty in producing a multilayered structure with a smooth surface. When the coefficient of dynamic friction is more than 0.35, resistance caused between the surface 1a and the roll during feed and advance is too high, so that the resulting surface 1a becomes wavy, making it difficult to produce a layered structure with a smooth surface.

The surface resistivity of the surface 1a of the substrate 1 is preferably $10^{13}$ $\Omega/cm^2$ or less, more preferably $10^{12}$ $\Omega/cm^2$ or less, and most preferably $10^{11}$ $\Omega/cm^2$ or less. When the surface resistivity is more than $10^{13}$ $\Omega/cm^2$, electrical shocks are felt by human bodies during the production of a multilayered structure.

According to the present invention, it is preferred that an adhesive layer is formed on the surface of the substrate 1 in contact with the photosensitive layer 2. As the adhesive layer, known adhesive compositions can be used. Examples of the adhesive composition include polyester type adhesives.

The thickness of the adhesive layer is preferably in the range of 5 to 50 μm, more preferably in the range of 10 to 40 μm, and most preferably in the range of 20 to 30 μm. When the thickness is less than 5 μm, there is a possibility that adhesion defect is caused by irregular adhesive coat. When the thickness is more than 50 μm, there is a possibility that bubbles are generated in the adhesive layer and the thickness of the adhesive layer varies.

As the photosensitive layer 2, known photosensitive resin compositions can be used. Examples of the photosensitive resin composition include aqueous development type photosensitive resin compositions, as described in Japanese Laid-Open Patent Publication Nos. 60-173055, 60-211451, 63-8648, 1-108542, 2-175702, 2-305805, and 3-228060.

The thickness of the photosensitive layer 2 is preferably in the range of 0.3 mm to 10 mm, more preferably in the range of 0.6 mm to 4 mm, and most preferably in the range of 1 mm to 3 mm. When he thickness is less than 0.3 mm, elasticity of the photosensitive layer 2 is not sufficient, so that appropriate printed matter cannot be obtained. When the thickness is more than 10 mm, precision of the thickness of the photosensitive layer 2 is not sufficient, so that appropriate printed matter cannot be obtained.

Furthermore, according to the present invention, it is preferred that an antitack layer described later is formed on the photosensitive layer 2.

As the antistatic cover film 3, polyester films containing an antistatic agent in the above-mentioned polyester can be used. Examples of the antistatic agent include anionic antistatic agents such as those of an alkyl sulfate type and an alkyl phosphate type; cationic antistatic agents such as those of a quaternary ammonium salt type, a quaternary ammonium resin type, and an imidazoline type; nonionic antistatic agents such as those of a sorbitan type, and an ether type; and amphoteric antistatic agents such as those of a betaine type.

The thickness of the antistatic cover film 3 is preferably in the range of 25 to 250 μm, more preferably in the range of 50 to 188 μm, and most preferably in the range of 75 to 125 μm. When the thickness is less than 25 μm, the antistatic cover film 3 is difficult to be peeled from a multilayered structure. When the thickness is more than 250 μm, there is a possibility that the antistatic cover film 3 is peeled from the multilayered structure even if it is not necessary.

The surface roughness of a surface $3a$ of the antistatic cover film 3 is preferably in the range of 1.05 to 3.55 μm, more preferably in the range of 1.5 to 3.0 μm, and most preferably in the range of 2.0 to 2.5 μm. When the surface roughness is less than 1.05 μm, the surface $3a$ slips when being fed and advanced by the rolls, making it difficult to produce a multilayered structure with a smooth surface. When the surface roughness is more than 3.55 μm, resistance caused between the surface $3a$ and the roll during feed and advance is too high, so that the surface $3a$ becomes wavy, resulting in difficulty in producing a multilayered structure with a smooth surface. Furthermore, the difference between the surface roughness of the surface $3a$ of the antistatic cover film 3 and that of the surface $1a$ of the substrate 1 is preferably 3.5 μm or less, more preferably 3.0 μm or less, and most preferably 2.5 μm or less. When the difference is more than 3.5 μm, the substrate 1 and the antistatic cover film 3 are fed and advanced by rolls at speeds substantially different from each other when a multilayered structure is produced as described later. This causes the surface of the resultant multilayered structure to become wavy, resulting in poor image reproducibility.

The coefficient of dynamic friction of the surface $3a$ of the antistatic cover film 3 is preferably in the range of 0.21 to 0.29, more preferably in the range of 0.22 to 0.29, and most preferably in the range of 0.25 to 0.28. When the coefficient of dynamic friction is less than 0.21, the surface $3a$ slips when being fed and advanced by the rolls, making it difficult to produce a multilayered structure with a smooth surface. When the coefficient of dynamic friction is more than 0.29, resistance caused between the surface $3a$ and the roll during feed and advance is too high, so that the surface $3a$ becomes wavy, resulting in difficulty in production of a multilayered structure with a smooth surface. Furthermore, the difference between the coefficient of dynamic friction of the surface $3a$ of the antistatic cover film 3 and that of the surface $1a$ of the substrate 1 is preferably 0.15 or less, more preferably 0.10 or less, and most preferably 0.05 or less. When the difference is more than 0.15, the substrate 1 and the antistatic cover film 3 are fed and advanced by the rolls at speeds substantially different from each other when the multilayered structure is produced as described later. This causes the surface of the resultant structure to become wavy, resulting in poor image reproducibility.

The surface resistivity of the surface $3a$ of the antistatic cover film 3 is preferably $10^{13}$ $\Omega/cm^2$ or less, more preferably $10^{11}$ $\Omega/cm^2$ or less, and most preferably $10^{9}$ $\Omega/cm^2$ or less. When the surface resistivity is more than $10^{13}$ $\Omega/cm^2$, an antistatic property is not sufficient.

Figure 2:
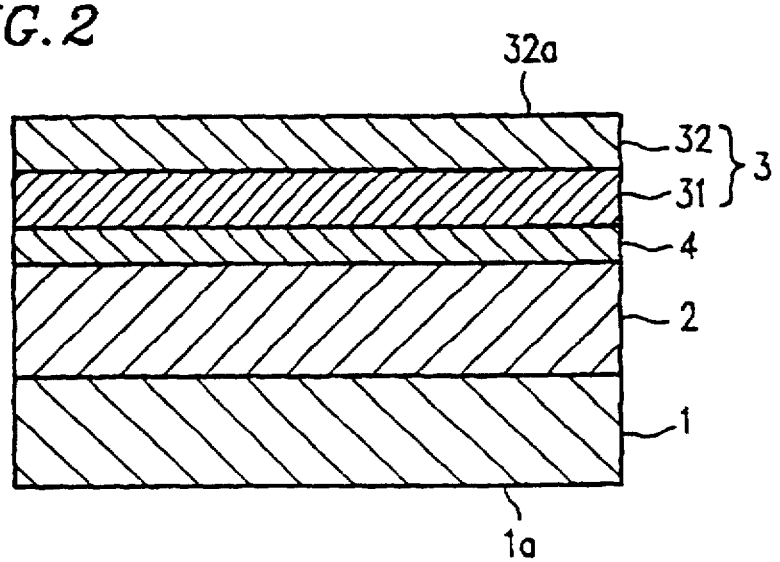
FIG. 2 is a cross-sectional view of an antistatic photosensitive multilayered structure of a preferred embodiment according to the present invention.

In a preferred embodiment, as shown in FIG. 2, the antistatic photosensitive multilayered structure of the present invention has the photosensitive layer 2, an antitack layer 4, and the antistatic cover film 3 on the substrate 1 in this order. The antistatic cover film 3 has a base layer 31 in contact with the photosensitive layer 2 and an antistatic surface layer 32 on the surface thereof opposite to the surface on which the base layer 31 is in contact with the photosensitive layer 2.

The antitack layer 4 is a non-adhesive layer. The antitack layer 4 is formed on the photosensitive layer 2 so as to avoid the problems such that a negative film adheres to the photosensitive layer 2 to prevent the bubbles from being removed from between the negative film and the photosensitive layer 2. The antitack layer 4 contains a resin examples of which are: polyamides such as nylon 6 and nylon 66; polyvinyl alcohols such as ethylene vinyl alcohol; cellulose such as cellulose acetate and ethyl cellulose; polyalkylene oxides such as polyethylene oxide; and polyelectrolytes such as sulfonated polystyrene.

The antitack layer 4 is provided by mixing the above-mentioned resin with an ester having a high saponification degree or a surfactant and coating the mixture onto the base layer 31, followed by drying it. Examples of the coating method include gravure coating, reverse-roll coating, spray coating, and a soaking method. The drying temperature is preferably in the range of 100° to 120° C., more preferably in the range of 105° to 115° C., and most preferably in the range of 105° to 110° C. Although the drying time is varied depending upon the drying temperature and the other drying conditions, it is preferably in the range of 2 to 5 minutes, more preferably in the range of 2 to 4 minutes, and most preferably in the range of 2 to 3 minutes. Furthermore, if required, the antitack layer 4 is subject to a surface treatment such as a corona treatment, if required.

The thickness of the antitack layer 4 is preferably in the range of 1.5 to 5.0 μm, more preferably in the range of 1.8 to 3.5 μm, and most preferably in the range of 2 to 3 μm. When the thickness is less than 1.5 μm, the antistatic cover film 3 is difficult to be peeled from the multilayered structure 4. When the thickness is more than 5.0 μm, there is a possibility that the antistatic cover film 3 is peeled from the multilayered structure, even when it is not required.

It is desired that the peel resistance between the antitack layer 4 and the base layer 31 is small. As the peel resistance is smaller, the resultant multilayered structure has a more outstanding antistatic property.

In addition to the above-mentioned polyesters, polyethylene, polypropylene, polystyrene, etc. can be used for the base layer 31 of the antistatic cover film 3. These are formed into films by a conventional method so as to be used as the base layer 31. Polyethylene terephthalate is preferred in terms of dimension stability, heat resistance, and a mechanical property.

The thickness of the base layer 31 is preferably in the range of 25 to 250 μm, more preferably in the range of 50 to 188 μm, and most preferably in the range of 75 to 125 μm. When the thickness is less than 25 μm, the base layer 31 is difficult to be peeled from the multilayered structure. When the thickness is more than 250 μm, there is a possibility that the base layer 31 is peeled from the multilayered structure, even when it is not necessary.

The surface of the base layer 31 can be smooth or matte with a surface roughness of 5 μm or less.

The antistatic surface layer 32 is made of a composition containing a polyolefin resin and a cationic surfactant. The antistatic surface layer 32 is provided by coating an emulsion containing a polyolefin resin and a cationic surfactant onto the base layer 31, followed by drying it.

Examples of the polyolefin resin include olefin homopolymers such as polyethylene and polypropylene; acryl modified polyolefins such as an ethylene-acrylic acid copolymer; urethane-modified polyolefins; and nylon-modified polyolefins. These polyolefin resins can be crystalline or amorphous. Polyethylene and polypropylene are preferred in terms of a coating property, transparency, scratch resistance, blocking resistance, environmental stability such as temperature stability and humidity stability. Although the number-average molecular weight of the polyolefin resin is not particularly limited, it is preferably in the range of 1500 to 5000, more preferably 3500 to 5000, and most preferably 4000 to 4500.

As the cationic surfactant, known cationic surfactants can be used. Examples of the cationic surfactant include alkyl ammonium chloride, trimethyl alkyl ammonium bromide, and alkyl pyridinium chloride.

The cationic surf actant can be contained preferably in an amount of 0.01 to 20% by weight, more preferably 0.05 to 20% by weight, and most preferably 0.1 to 10% by weight based on the total weight of the emulsion containing the above-mentioned polyolefin resin. When the content of the cationic surfactant is less than 0.01% by weight, the resultant multilayered structure has a poor antistatic property. When the content of the cationic surfactant is more than 20% by weight, the transparency of the antistatic surface layer 32 is insufficient. Furthermore, the resultant multilayered structure has insufficient blocking resistance and environmental stability.

The above-mentioned emulsion can be prepared preferably by adding a polyolefin type emulsion and a cationic surfactant to an aqueous medium in this order. By adding the polyolefin type emulsion and the cationic surfactant in this order, the aqueous medium is not gelled at all, and furthermore, the resultant film has outstanding transparency. Examples of the coating method include gravure coating, reverse-roll coating, spray coating, and a soaking method. The drying temperature is preferably in the range of 100° to 120° C., more preferably in the range of 105° to 115° C., and most preferably in the range of 105° to 110° C. Although the drying time is varied depending upon a drying temperature and the other drying conditions, it is preferably in the range of 2 to 5 minutes, more preferably in the range of 2 to 4 minutes, and most preferably in the range of 2 to 3 minutes.

The thickness of the antistatic surface layer 32 is preferably in the range of 0.01 to 1 μm, more preferably in the range of 0.02 to 0.06 μm, and most preferably in the range of 0.02 to 0.05 μm. When the thickness is less than 0.01 μm, an antistatic property is not sufficient. When the thickness is more than 1 μm, there is a possibility that blocking of the resulting multilayered structure occurs.

The surface roughness of a surface 32a of the antistatic surface layer 32 is preferably in the range of 1.05 to 3.50 μm, more preferably in the range of 1.5 to 3.0 μm, and most preferably in the range of 2.0 to 2.5 μm. When the surface roughness is less than 1.05 μm, the surface 32a slips while being fed and advanced by the rolls, making it difficult to produce a multilayered structure with a smooth surface. When the surface roughness is more than 3.50 μm, resistance caused between the surface 32a and the roll is too high, so that the surface 32a becomes wavy, resulting in difficulty in producing a multilayered structure with a smooth surface. Furthermore, the difference between the surface roughness of the surface 32a of the antistatic surface layer 32 and that of the surface 1a of the substrate 1 is preferably 3.5 μm or less, more preferably 3.0 μm or less, and most preferably 2.5 μm or less. When the difference is more than 3.5 m, the substrate 1 and the antistatic cover film 3 are fed and advanced by the rolls at speeds substantially different from each other when the multilayered structure is produced as described later. This causes the multilayered structure to become wavy, resulting in poor image reproducibility.

The coefficient of dynamic friction of the surface 32a of the antistatic surface layer 32 is preferably in the range of 0.22 to 0.28, more preferably in the range of 0.23 to 0.27, and most preferably in the range of 0.25 to 0.27. When the coefficient of dynamic friction is less than 0.22, the surface 32a slips when being fed and advanced by the rolls, making it difficult to produce a multilayered structure with a smooth surface. When the coefficient of dynamic friction is more than 0.28, resistance caused between the surface 32a and the roll is too high, so that the surface 32a becomes wavy, resulting in difficulty in production of a multilayered structure with a smooth surface. Furthermore, the difference between the coefficient of dynamic friction of the surface 32a of the antistatic surface layer 32 and that of the surface 1a of the substrate 1 is preferably 0.15 or less, more preferably 0.10 or less, and most preferably 0.05 or less. When the difference is more than 0.15, the substrate 1 and the antistatic cover film 3 are fed and advanced by the rolls at speeds substantially different from each other when the multilayered structure is produced as described later. This causes the surface of the multilayered structure to become wavy, resulting in image reproducibility.

The surface resistivity of the surface 32a of the antistatic surface layer 32 is preferably $10^{13}$ $\Omega/cm^2$ or less, more preferably $10^{11}$ $\Omega/cm^2$ or less, and most preferably $10^{9}$ $\Omega/cm^2$ or less. When the surface resistivity is more than $10^{13}$ $\Omega/cm^2$ an antistatic property is not sufficient.

According to the present invention, the antistatic photosensitive multilayered structure is produced as follows: A photosensitive resin composition for a photosensitive layer, extruded from an extruder is supplied to a nip between a film for a substrate to be fed and advanced in one direction by one of a pair of rolls and an antistatic cover film to be fed and advanced in the same direction as that of the film for the substrate by the other of a pair of rolls. The photosensitive resin composition thus supplied is heat-pressed, thereby forming a multilayered structure.

FIG. 3 is a schematic view showing the steps of producing the above-mentioned multilayered structure, which will be described below.

A pair of rolls 101 and 102 are provided, and a film 10 for a substrate is fed and advanced in one direction by the roll 102. The film 10 for a substrate preferably has an adhesive layer on a surface 10b which does not come into contact with the roll 102. An antistatic cover film 30 is fed and advanced in the same direction as that of the film 10 for a substrate by the roll 101. The antistatic cover film 30 preferably has an antitack layer on a surface 30b which does not come into contact with the roll 101.

A photosensitive resin composition 20 forming a photosensitive layer is supplied to a nip 103 between the rolls 101 and 102.

The difference between the surface roughness of the surface 30a of the antistatic cover film 30 which comes into contact with the roll 101 and the surface roughness of the surface 10a of the film 10 for a substrate which comes into contact with the roll 102 is 3.5 μm or less, preferably 3.0 μm or less, and more preferably 2.5 μm or less. When the difference is more than 3.5 μm, the film 10 for a substrate and the antistatic cover film 30 are fed and advanced by the rolls 102 and 101 at speeds substantially different from each other. This causes the surface of the resultant multilayered structure to become wavy, resulting in poor image reproducibility.

The difference between the coefficient of dynamic friction of the surface 30a of the antistatic cover film 30 which comes into contact with the roll 101 and the coefficient of dynamic friction of the surface 10a of the antistatic cover film 10 which comes into contact with the roll 102 is 0.15 or less, preferably 0.10 or less, and more preferably 0.05 or less. When the difference is more than 0.15, the film 10 for a substrate and the antistatic cover film 30 are fed and advanced by the rolls 102 and 101 at speeds substantially different from each other. This causes the surface of the resultant multilayered structure to become wavy, resulting in poor reproducibility.

Next, the film 10 for a substrate, the photosensitive resin composition 20, and the antistatic cover film 30 are heat-pressed to each other between the rolls 101 and 102, thereby forming a multilayered structure 40.

The temperature of the rolls 101 and 102 during heat-pressing is preferably in the range of 80° to 120° C., more preferably in the range of 80° to 110° C., and most preferably in the range of 90° to 100° C. Although the pressing time is varied depending upon the temperature of the rolls 101 and 102, it is preferably in the range of 10 seconds to 15 minutes, more preferably in the range of 20 seconds to 5 minutes, and most preferably in the range of 30 seconds to 3 minutes. The film advancing speed for enabling preferred pressing time is preferably in the range of 2 to 135 m/hour, more preferably in the range of 5 to 60 m/hour, and most preferably in the range of 6 to 40 m/hour.

The thickness of the multilayered structure 40 thus obtained is preferably in the range of 0.3 to 10 mm, more preferably in the range of 0.6 to 4 mm, and most preferably in the range of 1 to 3 mm. When the thickness is less than 0.3 mm, elasticity of the multilayered structure is not sufficient, so that appropriate printed matter cannot be obtained. When the thickness is more than 10 mm, precision of the thickness of the multilayered structure is not sufficient, so that appropriate printed matter cannot be obtained.

The friction charging voltage of the surface 30a of the antistatic cover film 30 of the antistatic photosensitive multilayered structure of the present invention is preferably 10 kV or less, more preferably 5 kV or less, and most preferably 3 kV or less. When the friction charging voltage is more than 10 kV, an antistatic property is not sufficient. In the present specification, the friction charging voltage refers to a voltage generated when the surface of the antistatic cover film is rubbed against PPC paper 20 times under the condition of a temperature of 20° C. and a relative humidity of 30%.

The peel charging voltage of the surface 30a of the antistatic cover film 30 is preferably 10 kV or less, more preferably 5 kV or less, and most preferably 3 kV or less. When the friction charging voltage is more than 10 kV, an antistatic property is not sufficient. In the present specification, the peel charging voltage refers to a voltage generated when the antistatic cover film is peeled off from the multilayered structure under the condition of a temperature of 20° C. and a relative humidity of 30%.

The antistatic photosensitive multilayered structure of the present invention has a photosensitive layer and an antistatic cover film on a substrate in this order. The multilayered structure of the present invention having such a structure is prevented from generating electric lines of force by the antistatic cover film, so that the surface of the multilayered structure opposite to the antistatic cover film as well as the surface of the antistatic cover film have an outstanding antistatic property.

In the antistatic photosensitive multilayered structure of the present invention, the antistatic cover film preferably has three layers: a base layer, an antistatic surface layer, and an antitack layer. Such a specific antistatic cover film remarkably prevents the generation of electric lines of force while the antistatic cover film is subject to friction or peeled off from the multilayered structure; therefore, the surface of the multilayered structure opposite to the antistatic cover film as well as the surface of the antistatic cover film have an outstanding antistatic property.

In the method for producing the multilayered structure of the present invention, a substrate and an antistatic cover film whose difference in surface roughness and coefficient of dynamic friction is very small are layered. Because of this, the sliding property of the substrate and that of the antistatic cover film with respect to rolls are almost the same. This means that the substrate and the antistatic cover film are fed and advanced by the rolls at almost the same speeds. Thus, a multilayered structure with a satisfactorily smooth surface and outstanding image reproducibility can be obtained.

As described above, the antistatic photosensitive multilayered structure of the present invention has an outstanding antistatic property and image reproducibility. Therefore, it is very useful for printing plates such as a photosensitive convex plate, a photosensitive flat plate, a photosensitive concave plate, and photosensitive flexographic plate, and a photoresist.

EXAMPLES

Hereinafter, the present invention will be described by way of illustrative examples. It is noted that the present invention is not limited thereto and parts and % in the examples are all based on a weight.

Production Examples

Compositions used in the examples of the present invention and the comparative examples were prepared and films used therein were formed by the following methods.

Production Example 1.1

Formation of an Antistatic Cover Film

First, 0.6 parts of high density polyethylene emulsion E6000, produced by Toho Chemical Industry Co., Ltd.) of 35% solid content was added to 500 parts of pure water, and the mixture was stirred at room temperature for 10 minutes. Then, 0.25 parts of a cationic surfactant (CHEMISTAT 6300H, produced by Sanyo Chemical Industries, Ltd.) and 47 parts of methanol were added to the emulsion and stirred for 10 minutes to give an emulsion containing 0.038% polyolefin and 0.17% cationic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.02 μm.

Separately, 25 parts of polyvinyl alcohol (GOSENOL AH-26, produced by Nippon Kasei Chemical Co., Ltd.) with a saponification degree of 97.0 to 98.8% was added to 964 parts of pure water and stirred at 90° C. for one hour. The mixture thus obtained was cooled down to room temperature, and 10.7 parts of 1,2-propylene glycol and 0.3 parts of nonionic surfactant (EPAN 740, produced by Daiichi Seiyaku Co., Ltd.) were gradually added to the mixture while being stirred. The mixture was stirred for another 30 minutes to give an antitack coating emulsion.

The coating solution was coated onto the surface of the above-mentioned film opposite to the coat layer by a wire bar (#36). The resultant film was dried at an air velocity of 0.5 m/sec. for 3 minutes in an oven at 110° C. to give an antistatic cover film having an antitack layer with a thickness of 1.9 μm and an antistatic surface layer with a thickness of 0.02 μm.

Production Example 1.2

Formation of an Antistatic Cover Film

First, 0.6 parts of high density polyethylene emulsion (E6000, produced by Toho Chemical Industry Co., Ltd.) of 35% solid content was added to 10 parts of pure water, and the mixture was stirred at room temperature for 10 minutes. Then, 0.05 parts of a cationic surfactant (ELECOND PQ-10, produced by Soken Kagakusha) of 50% solid content and 10 parts of methanol were added to the emulsion and stirred for 10 minutes to give an emulsion containing 0.12% cationic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.02 μm. The subsequent process was conducted in the same way as in Production Example 1.1 to give an antistatic cover film.

Production Example 1.3

Formation of an Antistatic Cover Film

First, 0.6 parts of crystalline polypropylene emulsion (E433N, produced by Toho Chemical Industry Co., Ltd.) of 30% solid content was added to 12 parts of pure water, and the mixture was stirred at room temperature for 10 minutes. Then, 0.05 parts of a cationic surfactant (ELECOND PQ-10, produced by Soken Kagakusha) of 50% solid content and 47 parts of methanol were added to the emulsion and stirred for 10 minutes to give an emulsion containing 0.3% polypropylene and 0.04% cationic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.02 μm. The subsequent process was conducted in the same way as in Production Example 1.1 to give an antistatic cover film.

Production Example 1.4

Formation of an Antistatic Cover Film

First, 0.4 parts of medium density polyethylene emulsion (E68A, produced by Toho Chemical Industry Co., Ltd.) of 20% solid content was added to 12 parts of pure water, and the mixture was stirred at room temperature for 10 minutes. Then, 15 parts of a cationic surfactant (ELECOND PQ-10, produced by Soken Kagakusha) of 50% solid content and 47 parts of methanol were added to the emulsion and stirred for 10 minutes to give an emulsion containing 0.12% polyethylene and 10% cationic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.02 μm. The subsequent process was conducted in the same way as in Production Example 1.1 to give an antistatic cover film.

Production Example 1.5

Formation of an Antistatic Cover Film

First, 0.6 parts of medium density polyethylene emulsion (E68A, produced by Toho Chemical Industry Co., Ltd.) of 20% solid content was added to 12 parts of pure water, and the mixture was stirred at room temperature for 10 minutes. Then, 36 parts of a cationic surfactant (ELECOND PQ-10, produced by Soken Kagakusha) of 50% solid content and 47 parts of methanol were added to the emulsion and stirred for 10 minutes to give an emulsion containing 0.12% polyethylene and 18.8% cationic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.02 μm. The subsequent process was conducted in the same way as in Production Example 1.1 to give an antistatic cover film.

Production Example 1.6

Formation of an Antistatic Cover Film

First, 0.15 parts of high density polyethylene emulsion (E6000, produced by Toho Chemical Industry Co., Ltd.) of 35% solid content was added to 500 parts of pure water, and the mixture was stirred at room temperature for 15 minutes. Then, 2.4 parts of a cationic surfactant (CHEMISTAT 6300H, produced by Sanyo Chemical Industries, Ltd.) was added to the emulsion and stirred for 10 minutes to give an emulsion containing 0.01% polyethylene and 0.17% cationic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.03 μm. The subsequent process was conducted in the same way as in Production Example 1.1 to give an antistatic cover film.

Production Example 2.1

Formation of an Antistatic Cover Film for a Comparative Example

A mat polyethylene terephthalate film (TC-5002, produced by Toyo Cloth Co., Ltd.) having a surface roughness of 3.06 μm and a thickness of 95 μm, which was not subject to treatment, was used.

The same antitack coating solution as that of Production Example 1.1 was coated onto one surface of the film in the same way as in Production Example 1.1 to give a film having no antistatic surface layer.

Production Example 2.2

Formation of an Antistatic Cover Film for a Comparative Example

First, 0.6 parts of medium density polyethylene emulsion (E68A, produced by Toho Chemical Industry Co., Ltd.) of 20% solid content was added to 12 parts of pure water, and the mixture was stirred at room temperature for 10 minutes. Then, 0.01 parts of a cationic surfactant (ELECOND PQ-10, produced by Soken Kagakusha) of 50% solid content and 47 parts of methanol were added to the emulsion and stirred for 10 minutes to give an emulsion containing 0.2% polyethylene and 0.008% cationic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.02 μm. The subsequent process was conducted in the same way as in Production Example 1.1 to give an antistatic cover film.

Production Example 2.3

Formation of an Antistatic Cover Film for a Comparative Example

First, 0.4 parts of medium density polyethylene emulsion (E68A, produced by Toho Chemical Industry Co., Ltd.) of 20% solid content was added to 10 parts of pure water, and the mixture was stirred at room temperature for 10 minutes. Then, 0.08 parts of an anionic surfactant (SANOL PP2030, produced by Lion Corporation) of 30% solid content and 10 parts of methanol were added to the emulsion and stirred for 10 minutes to give an emulsion containing 0.12% polyethylene and 0.1% anionic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (antistatic surface layer) with a thickness of 0.02 μm. The subsequent process was conducted in the same way as in Production Example 1.1 to give an antistatic cover film.

Production Example 2.4

Formation of an Antistatic Cover Film for a Comparative Example

First, 0.12 parts of medium density polyethylene emulsion (E68A, produced by Toho Chemical Industry Co., Ltd.) of 20% solid content was added to 10 parts of pure water, and the mixture was stirred at room temperature for 10 minutes. Then, 0.02 parts of a nonionic surfactant (EPAN 740, produced by Dai-ichi Kogyo Seiyaku Co., Ltd.) of 100% solid content and 10 parts of methanol were added to the emulsion and stirred for 10 minutes to give an emulsion containing 0.12% polyethylene and 0.1% nonionic surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.02 μm. The subsequent process was conducted in the same way as in Production Example 1.1 to give an antistatic cover film.

Production Example 2.5

Formation of an Antistatic Cover Film for a Comparative Example

First, 0.12 parts of medium density polyethylene emulsion (E68A, produced by Toho Chemical Industry Co., Ltd.) of 20% solid content was added to 10 parts of pure water, and the mixture was stirred at room temperature for 10 minutes. Then, 0.1 parts of an amphoteric surfactant (ELECTROSTRIPPER AC, produced by Kao Corporation) of 25% solid content and 10 parts of methanol were added to the emulsion and stirred for 10 minutes to give an emulsion containing 0.12% polyethylene and 0.12% amphoteric surfactant. The resultant emulsion was coated onto a mat polyethylene terephthalate film (TC-5002, produced by Toyo Cloth Co., Ltd.) having a surface roughness of 3.06 μm and a thickness of 95 μm as a base layer by a wire bar (#6). The film thus obtained was dried at an air velocity of 0.5 m/sec. for 2 minutes in an oven at 110° C. to give a film having a coat layer (i.e., antistatic surface layer) with a thickness of 0.02 μm. The subsequent process was conducted in the same way as in Production Example 1.1 to give an antistatic cover film.

Production Example 3

Preparation of a Photosensitive Resin Composition Dispersion

First, 21.8 parts of hexamethylene diisocyanate, 15.4 parts of dimethylolpropionic acid, 7.6 parts of polytetramethylene glycol (PG-100, produced by Nippon Polyurethane Industry Co., Ltd.), and 1.0 part of di-n-butyltin dilaurate were dissolved in 300 parts of tetrahydrofuran. The solution was charged in a 1-liter flask equipped with a stirrer and stirred at 65° C. for 3 hours. A solution prepared by dissolving 55.3 parts of an acrylonitrile-butadiene oligomer (Hycar ATBNX 1300x16, produced by Ube Industiries Ltd.) having an amino group at its molecular terminal in 100 parts of methyl ethyl ketone were added to the reaction solution while being stirred at room temperature. Tetrahydrofuran and methyl ethyl ketone was removed from the resultant solution by drying the solution under reduced pressure to obtain a crude polymer having a number average molecular weight of 21000. Then, 100 parts of the crude polymer were dissolved in 100 parts of methyl ethyl ketone, and 100 parts of methanol in which 4.8 parts of lithium hydroxide were dissolved were added to the solution thus obtained while being stirred at room temperature. The solution thus obtained was stirred for another 30 minutes to obtain a hydrophilic polymer.

Then, 10 parts of the hydrophilic polymer, 45 parts of chlorinated polyethylene (H-135, produced by Osaka Sodasha), 15 parts of styrene-butadiene rubber (JSR1507, produced by Japan Synthetic Rubber Co., Ltd.), 28.5 parts of butadiene oligoacrylate (PB-A, produced by Kyoueisha Yushisha), 1 part of benzylmethylketone acetal (IRUGACURE 651, CIBA-GEIGY Corporation), and 0.5 parts of hydroquinone monomethyl ether were dispersed in 40 parts of toluene and 10 parts of water. The resultant mixture was kneaded at 105° C. by using a heating kneader and degassed to obtain a photosensitive resin composition dispersion.

Production Example 4

Formation of a Film for a Substrate

First, an adhesive was prepared from 59 parts of a copolymer polyester (RV-30SS, produced by Toyobo Co., Ltd.), 25 parts of a copolymer polyester (RV-20SS, produced by Toyobo Co., Ltd.), 10 parts of a reaction product of tolylenediisocyanate and trimethylol propane (COLONATE L, produced by Nippon Polyurethane Industry Co., Ltd.), and 0.2 parts of a curing catalyst. The adhesive was coated onto an in-line coated antistatic polyester film (A6300, produced by Toyobo Co., Ltd.) having a thickness of 100 μm, a surface resistivity of $8 \times 10^9$ $\Omega/cm^2$ and a friction charging voltage of 4 to 6 kV. The resultant film was dried at 110° C. for 3 minutes so that an adhesive layer with a thickness of 20 μm was formed thereon, thereby obtaining a film for a substrate.

Example 1

The photosensitive resin composition dispersion obtained in Production Example 3 was coated and dried on the adhesive layer of the film for a substrate obtained in Production Example 4 to give a photosensitive layer.

The antistatic cover film obtained in Production Example 1.1 was placed on the photosensitive layer so as to bring the antitack layer into contact with the photosensitive layer and heat-pressed to obtain a multilayered structure with a thickness of 2.0 mm. The heat pressing was conducted under the condition of a pressing plate temperature of 100° C., a pressure of 15 kg/cm², and a pressing time of 30 seconds. The multilayered structure was cut into a size of 210 mm×297 mm to obtain a test sample.

The test sample was evaluated with respect to the following items 1 to 6. Tables 1 and 2 show the evaluation results.

(1) Surface Resistivity

The test sample was placed under an atmosphere of a temperature of 20° C. and a relative humidity of 30%. Then, a voltage of 500 V was applied to the test sample for 30 seconds. The resistivity of the surface of the antistatic cover film under the application of a voltage was measured by a resistor (HIGHRESTA IP, MCP-HT260, manufactured by Mitsubishi Petrochemical Co., Ltd.).

(2) Friction Charging Voltage

The surface of the antistatic cover film of the test sample was rubbed against PPC paper 20 times under an atmosphere of a temperature of 200° C. and a relative humidity of 30%. Immediately after the rubbing, the friction charging voltage of the test sample was measured by an electrostatic analyzer (STATICCHECKER SC-201, manufactured by Audio Technica).

(3) Peel Charging Voltage

The antistatic cover film was peeled off from the test sample under an atmosphere of a temperature of 20° C. and a relative humidity of 30%. During the production of the multilayered structure, the antitack layer was transferred onto the photosensitive layer, and hence, the antitack layer remained on the photosensitive layer when the antistatic cover film was peeled off. Immediately after the peeling, charging voltages of the surface of the antistatic surface layer of the antistatic cover film, the surface of the substrate opposite to the antistatic cover film, and the surface of the antitack layer were measured by an electrostatic analyzer (STATICCHECKER SC-201, manufactured by Audio Technica).

(4) Adhesion of Foreign Matter

Ninety percent masked negative film was placed on the antitack layer of the test sample from which the antistatic cover film had been peeled off. Then, the resultant test sample was exposed to light at a luminous intensity of 25 W/m² for 5 minutes by using a mercury lamp (manufactured by Dainippon Screen Mfg. Co., Ltd.). The negative film was removed from the test sample and the number of foreign matters adhered onto the surface of the photosensitive layer was measured by a microplotter (PR8-8LT, manufactured by Mutow Co., Ltd.)

(5) Electric Shock

The electric shocks felt by human bodies during the measurement of the friction charging voltage and the peel charging voltage were checked.

(6) Pinholes of Printed Matter

The test sample ready for a printing plate in the above item 4 was developed with a developer by the use of a brush to form a test relief. Printing was conducted using the relief and pinholes of the printed matter thus obtained were observed.

Comparative Example 1

A test sample was obtained in the same way as in Example 1 except that the antistatic cover film obtained in Production Example 2.1 was used. The test sample was evaluated with respect to the above items 1 to 6. Table 1 and 2 show the evaluation results.

Example 2

A test sample was obtained in the same way as in Example 1 except that the antistatic cover film obtained in Production Example 1.2 was used. The test sample was evaluated with respect to the above items 1 to 6. Tables 1 and 2 show the evaluation results.

Example 3

A test sample was obtained in the same way as in Example 1 except that the antistatic cover film obtained in Production

17

Example 1.3 was used. The test sample was evaluated with respect to the above items 1 to 6. Tables 1 and 2 show the evaluation results.

Comparative Example 2

A test sample was obtained in the same way as in Example 1 except that the antistatic cover film obtained in Production Example 2.2 was used. The test sample was evaluated with respect to the above items 1 to 6. Tables 1 and 2 show the evaluation results.

Example 4

A test sample was obtained in the same way as in Example 1 except that the antistatic cover film obtained in Production Example 1.4 was used. The test sample was evaluated with respect to the above items 1 to 6. Tables 1 and 2 show the evaluation results.

Example 5

A test sample was obtained in the same way as in Example 1 except that the antistatic cover film obtained in Production Example 1.5 was used. The test sample was evaluated with respect to the above items 1 to 6. Tables 1 and 2 show the evaluation results.

Comparative Example 3

A test sample was obtained in the same way as in Example 1 except that the antistatic cover film obtained in Production Example 2.3 was used. The test sample was evaluated with respect to the above items 1 to 6. Tables 1 and 2 show the evaluation results.

Comparative Example 4

A test sample was obtained in the same way as in Example 1 except that the antistatic cover film obtained in Production Example 2.4 was used. The test sample was evaluated with respect to the above items 1 to 6. Tables 1 and 2 show the evaluation results.

Comparative Example 5

A test sample was obtained in the same way as in Example 1 except that the antistatic cover film obtained in Production Example 2.5 was used. The test sample was evaluated with respect to the above items 1 to 6. Tables 1 and 2 show the evaluation results.

Example 6

The antistatic film obtained in Production Example 1.6 was fed and advanced by the roll 101 shown in FIG. 3 and the film for a substrate obtained in Production Example 4 was fed and advanced by the roll 102 shown in FIG. 3. The photosensitive resin composition obtained in Production Example 3 was supplied to the nip 103 by the extruder 200 so as to come into contact with the antitack layer of the antistatic cover film and the adhesive layer of the film for a substrate. The film for the substrate, the photosensitive composition, and the antistatic cover film were heat-pressed to each other between the rolls 101 and 102 to obtain a multilayered structure. The film advancing speed of the rolls 101 and 102 was 3 cm/min., the rolls' temperature was 80° C., the heat-pressing time was about one minute, and the thickness of the multilayered structure thus obtained was 2.84 mm.

The surface roughness of the surface of the antistatic cover film, which came into contact with the roll 101, was

18

2.50 μm, and that of the surface of the film for a substrate, which came into contact with the roll 102, was 0.5 μm. The difference therebetween was 2.0 μm. The coefficient of dynamic friction of the surface of the antistatic cover film, which came into contact with the roll 101, was 0.17, and the coefficient of dynamic friction of the surface of the antistatic cover film, which came into contact with the roll 102, was 0.25. The difference therebetween was 0.008. The surface roughness and the coefficient of dynamic friction were measured in the following manner:

Surface Roughness (Non-contact Surface Measurement)

A laser beam was irradiated to the surface of a sample under the condition of a constant temperature and a constant humidity. The surface shape was automatically analyzed by a computer. As a measurement device, a non-contact surface shape analyzer (SAS-2010, manufactured by Meishin Koki) was used.

Coefficient of Dynamic Friction

The coefficient of dynamic friction of both surfaces of the test sample was measured with a tensilometer (TENSILON, manufactured by ORIENTEC) in accordance with ASTM D1894 by the following method. A standard sample plate for a friction test such as foam rubber was fixed onto a horizontal fixed plate of the tensilometer and the test sample was fixed onto a movable plate. The movable plate was placed on the fixed plate so that the surface of the standard sample plate for a friction test comes into contact with the measurement surface of the test sample. Then, the movable plate was pulled under a load F of 4.4 kg. The initial load fd at this time was measured so as to calculate the coefficient of dynamic friction by the following equation.

Coefficient of dynamic friction $\mu = fd/F$

The subsequent process was conducted in the same way as in Example 1 to obtain a test sample. The test sample was evaluated with respect to the above items 1 to 6. Tables 1 and 2 show the evaluation results.

TABLE 1

| | Content of surfactant (wt %) | Surface resistivity (Ω/cm²) | Friction charging voltage (KV) | | Electric shock |
|---|---|---|---|---|---|
| | | | Antistatic surface layer | Opposite surface | |
| Example 1 | cationic 0.17 | $1.0 \times 10^{11}$ | 2–4 | 3 | ◯ |
| Example 2 | cationic 0.12 | $1.5 \times 10^{12}$ | 1–3 | 3 | ◯ |
| Example 3 | cationic 0.04 | $3.0 \times 10^{12}$ | 1–3 | 1–2 | ◯ |
| Example 4 | cationic 10 | $3.4 \times 10^{7}$ | 1–2 | 1–2 | ◯ |
| Example 5 | cationic 18.8 | $1.3 \times 10^{7}$ | 1–2 | 1–2 | ◯ |
| Example 6 | cationic 0.17 | $1.0 \times 10^{11}$ | 2–4 | 3 | ◯ |
| Comparative Example 1 | — | $>10^{13}$ | 20 | 20 | X |
| Comparative Example 2 | cationic 0.008 | $>10^{13}$ | 20 | 20 | X |
| Comparative Example 3 | anionic 0.1 | $1.2 \times 10^{12}$ | 15 | 15 | X |
| Comparative Example 4 | nonionic 0.1 | $2.7 \times 10^{12}$ | 15 | 15 | X |
| Comparative Example 5 | amphoteric 0.12 | $4.0 \times 10^{12}$ | 15 | 15 | X |

◯: No shock felt
X: Shock felt

TABLE 2

| | Peel charging voltage (KV) | | | Electric shock | Number of adhered foreign matters | Pinholes in printed matter |
|---|---|---|---|---|---|---|
| | Antistatic surface layer | Opposite surface | Antitack layer | | | |
| Example 1 | 0–1 | 0–1 | 0–1 | ○ | 3 | ◯ |
| Example 2 | 0–1 | 0–1 | 0–1 | ○ | 5 | ◯ |
| Example 3 | 0–1 | 0–1 | 0–1 | ○ | 2 | ◯ |
| Example 4 | 0–1 | 0–1 | 0–1 | ○ | 2 | ◯ |
| Example 5 | 0–1 | 0–1 | 0–1 | ○ | 2 | ◯ |
| Example 6 | 0–1 | 0–1 | 0–1 | ○ | 3 | ◯ |
| Comparative Example 1 | 20 | 20 | 15–20 | X | 17–18 | X |
| Comparative Example 2 | 20 | 20 | 10–15 | X | 15–20 | X |
| Comparative Example 3 | 15 | 15 | 10–15 | X | 17 | X |
| Comparative Example 4 | 15 | 15 | 10–15 | X | 25 | X |
| Comparative Example 5 | 20 | 20 | 15–20 | X | 23 | X |

○: No shock felt
X: Shock felt
◯: None present
X: Present

As is apparent from Tables 1 and 2, the antistatic photosensitive multilayered structure of the present invention has a very small friction charging voltage and peel charging voltage; therefore, electric shocks to human bodies are not recognized. Furthermore, since the multilayered structure hardly attracts foreign matters, printed matter obtained by using the multilayered structure has an outstanding quality without any pinholes.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An antistatic photosensitive multilayered structure comprising a substrate, a photosensitive layer, an antitack layer and an antistatic cover film in this order, the antistatic cover film having a base layer in contact with the antitack layer and an antistatic surface layer on a side opposite to the photosensitive layer, and the antistatic surface layer being made of a composition containing a polyolefin resin and a cationic surfactant.

2. An antistatic photosensitive multilayered structure according to claim 1, wherein the difference between surface roughness of the surface of the substrate opposite to the photosensitive layer and surface roughness of the surface of the antistatic cover film opposite to the photosensitive layer is not more than 3.5 μm.

3. An antistatic photosensitive multilayered structure according to claim 1, wherein the difference between the coefficient of dynamic friction of the surface of the substrate opposite to the photosensitive layer and the coefficient of dynamic friction of the surface of the antistatic cover film opposite to the photosensitive layer is not more than 0.15.

4. An antistatic photosensitive multilayered structure according to claim 1, wherein the surface resistivity of the antistatic cover film is not more than $10^{13}$ Ω/cm².

5. An antistatic photosensitive multilayered structure according to claim 1, wherein the cationic surfactant is contained in an amount of 0.01 to 20% by weight based on a total weight of an emulsion containing the cationic surfactant and the polyolefin resin, forming the antistatic surface layer.

6. An antistatic photosensitive multilayered structure according to claim 5, wherein the substrate has a surface resistivity of not more than $10^{13}$ Ω/cm².

7. A method for producing an antistatic photosensitive multilayered structure having a photosensitive layer and an antistatic cover film on a substrate in this order by extrusion-lamination, comprising the steps of:

supplying a photosensitive composition forming a photosensitive layer extruded by an extruder to a nip between a film for the substrate to be fed and advanced in one direction by one of a pair of rolls and an antistatic cover film to be fed and advanced in the same direction as that of the film for the substrate by the other of the pair of rolls, the antistatic cover film beinq comprised of a base layer in contact with an antitack layer and an antistatic surface layer on a side opposite to the antitack layer, wherein the photosensitive layer comes into contact with the antitack layer of the antistatic cover film, and heat-pressing the film for the substrate, the photosensitive resin composition, and the antistatic cover film to each other between the pair of rolls.

8. The method according to claim 7 wherein the antistatic surface layer is made of a composition containing a polyolefin resin and a cationic surfactant.

9. The method according to claim 7 wherein the difference between surface roughness of the surface of the substrate which comes into contact with the one of the pair of rolls and surface roughness of the surface of the antistatic cover film which comes into contact with the other of the pair of rolls is not more than 3.5 μm.

10. The method according to claim 7 wherein the difference between a coefficient of dynamic friction of the surface of the substrate which comes into contact with the one of the pair of rolls and a coefficient of dynamic friction of the surface of the antistatic cover film which comes into contact with the other pair of rolls is not more than 0.15.

* * * * *

UNITED STATES PATENT AND TRADEMARK OFFICE
CERTIFICATE OF CORRECTION

PATENT NO.   : 5,780,202
DATED        : July 14, 1998
INVENTOR(S)  : Shigenori Nagahara, et al.

It is certified that error appears in the above-identified patent and that said Letters Patent is hereby corrected as shown below:

Column 3,
Line 1, change "ones" to --one--.

Column 4,
Line 13, before "each" insert --of--.
Line 15, before "each" insert --of--.
Line 59, "/cm$^2$" should not be superscript and should not be italic.

Column 6,
Line 25, "/cm$^2$" near end of line should not be superscript and should not be italic.
Line 26, "/cm$^2$" near end of line should not be superscript and should not be italic.

Column 7,
Line 49, change "surf actant" to --surfactant--.

Column 8,
Line 59, before "image" insert --poor--.
Line 64, "/cm$^2$" should not be italic.

Column 11,
Line 14, change "E6000." to --(E6000.--.

UNITED STATES PATENT AND TRADEMARK OFFICE
CERTIFICATE OF CORRECTION

PATENT NO. : 5,780,202
DATED : July 14, 1998
INVENTOR(S) : Shigenori Nagahara, et al.

It is certified that error appears in the above-identified patent and that said Letters Patent is hereby corrected as shown below:

Column 15,
Line 7, change "was" to --were--.
Line 41, "/cm$^2$" should not be superscript and should not be italic.

Column 16,
Line 9, change "200°" C." to --20° C.--.

Column 20,
Line 17, change "claim 5" to --claim 1--.
Line 30, change "beinq" to --being--.

Signed and Sealed this

Third Day of July, 2001

*Attest:*

NICHOLAS P. GODICI
*Attesting Officer*  *Acting Director of the United States Patent and Trademark Office*